(12) United States Patent
Bessho et al.

(10) Patent No.: US 6,480,412 B1
(45) Date of Patent: Nov. 12, 2002

(54) MAGNETIZATION CONTROL METHOD, INFORMATION STORAGE METHOD, MAGNETIC FUNCTIONAL DEVICE, AND INFORMATION STORAGE DEVICE

(75) Inventors: Kazuhiro Bessho, Kanagawa (JP); Yoh Iwasaki, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/697,540

(22) Filed: Oct. 26, 2000

(30) Foreign Application Priority Data

Oct. 27, 1999 (JP) .......................... 11-305520
Apr. 20, 2000 (JP) ....................... 2000-119589

(51) Int. Cl.[7] .............................................. G11C 11/15
(52) U.S. Cl. ...................... 365/173; 365/171; 365/145
(58) Field of Search ................... 365/32, 33, 173, 365/171, 48, 55

(56) References Cited

U.S. PATENT DOCUMENTS

| | | | |
|---|---|---|---|
| 5,491,600 A | * | 2/1996 | Chen et al. .................. 360/113 |
| 5,792,569 A | * | 8/1998 | Sun et al. .................... 428/692 |
| 5,966,323 A | * | 10/1999 | Chen et al. .................. 365/158 |
| 6,052,262 A | * | 4/2000 | Kamiguchi et al. .......... 360/113 |
| 6,178,112 B1 | * | 1/2001 | Beesho et al. ............... 365/173 |
| 6,272,036 B1 | * | 8/2001 | You et al. ...................... 365/97 |

FOREIGN PATENT DOCUMENTS

| | | |
|---|---|---|
| EP | 0971423 | 7/1998 |
| GB | 2333900 | 4/1998 |
| JP | 09307156 | 11/1997 |

* cited by examiner

Primary Examiner—David Nelms
Assistant Examiner—Thong Le
(74) Attorney, Agent, or Firm—Sonnenschein, Nath & Rosenthal

(57) ABSTRACT

A potential barrier region is positioned in direct or indirect contact with a region containing a magnetic element. The region containing a magnetic body has a multi-layered structure in which two ferromagnetic layers are separated by a non-magnetic intermediate layer, for example. The potential barrier region may be composed of a metal layer and a semiconductor layer, for example, and a Schottky barrier is produced between them. Magnetization of the region containing a magnetic body is controlled by modulating the potential barrier of the potential barrier region by means of application of an electric field. By using at least one magnetization of the region containing a magnetic element, storage of information is effected.

19 Claims, 13 Drawing Sheets

POTENTIAL BARRIER REGION

MAGNETIZATION CONTROL METHOD, INFORMATION STORAGE METHOD, MAGNETIC FUNCTIONAL DEVICE, AND INFORMATION STORAGE DEVICE

RELATED APPLICATION DATA

The present application claims priority to Japanese Application No. P11-305520 filed Oct. 27, 1999, and to Japanese application No. P2000-119589 filed Apr. 20, 2000, which applications are incorporated herein by reference to the extent permitted by law.

BACKGROUND OF THE INVENTION

1. Field of the Invention

This invention relates to a magnetization control method, information storage method, magnetic functional device and information storage device, which are suitable for application to a solid magnetic memory, for example.

2. Description of the Related Arts

Along with epoch-making diffusion of information communication apparatuses, especially, personal-use information apparatuses such as portable terminals, their constituent devices such as memory and logic are requested to have higher performances, such as higher integration, higher speed, lower power consumption, and so on. Especially, progression of nonvolatile memory toward higher densities and larger capacities is getting more and more important as complementary techniques with magnetic hard disks that are essentially difficult to progress reduction in size, increase the speed and decrease the power consumption because of the existence of movable members and other reasons.

Semiconductor flash memory and FeRAM (ferroelectric nonvolatile memory) are currently used in practice as nonvolatile memory, and various efforts are still continued toward higher performances. However, flash memory and FeRAM involve the following essential drawbacks derived from their fundamentals of operation, structures, and materials employed.

<Flash Memory>
1. For writing, injection of hot electrons into floating gates is employed. However, injection efficiency is usually as low as $10^{-6}$, and it needs a time in the order of ps for accumulating an electric charge sufficient for storage.
2. If an effort is made to increase the injection efficiency in (1) above, (for example, the use of Fowler-Nordheim tunneling injection), the device structure is inevitably complicated. This makes it difficult to realize a higher integration, and such a complicated structure causes a high cost.
3. Either hot electron injection or tunneling injection needs a high voltage (typically more than 10 V), and its power consumption is large. Additionally, an inverter is required for portable use, and this is disadvantageous for miniaturization.
4. A tunneling oxide film around floating gates deteriorates progressively with occurrences of writing. It results in inducing the leak current, promoting outflow of charges for storage, and degrading the reliability. Typical endurance is about 100,000 times.

<FeRAM>
1. Ferroelectric element, which is a metal oxide, is easily affected by a reducing atmosphere that is indispensable for a silicon process, and it does not match such process.
2. Oxides, in general, need a process under a high temperature, which is a disadvantageous condition in microminiaturization of design rules. That is, this disturbs high-density integration. Although it has a device structure enabling integration as high as DRAM, or the like, it is generally considered that those factors limit the degree of integration to 10 Mb/inch$^2$, maximum.

As nonvolatile memory not involving those drawbacks, magnetic memory called MRAM (magnetic random access memory) as disclosed by Wang et al., IEEE Trans. Magn. 33(1997), 4498, for example, has been recently brought into attention.

MRAM is a magnetic information storage device in which fine storage media of a magnetic body are regularly arranged, and wirings are provided to allow each of the storage media to be accessed to. Writing is performed by using a current-magnetic field generated by flowing a current in both a selection line (word line) and a read line (bit line) provided above the storage media and controlling magnetization of individual magnetic elements forming the storage media. Reading is performed by using a current-magnetic effect. Since MRAM has a simple structure, high integration thereof is easy, and because of its way of storage by rotation of a magnetic moment, its maximum endurance is large. Additionally, it does not need a high voltage, and needs almost no oxide difficult to make. Just after its proposal, a long access (read) time was a problem. Today, however, where a high output can be obtained by using GMR (giant magnetoresistance effect and TMR (tunneling magnetoresistance) effect, the problem of its access time has been improved significantly.

This MRAM, however, involves an essential problem in its writing method from the standpoint of more advanced integration. More specifically, as the wirings become thinner along with progressively higher integration, the critical value of the current that can be supplied to the write line decreases, and therefore, the magnetic field obtained becomes so small that the coercive force of the storage region must be lowered. This means that the reliability of the information storage device degrades. Further, since magnetic field, in general, cannot be converged unlike light or electron beams, its high integration may cause cross-talk. Thus, writing relying upon a current-magnetic field essentially involves those problems, which may become large drawbacks of MRAM.

Similarly to flash memory and FeRAM, those problems will be removed if magnetization can be controlled by mere electric stimulation, i.e., without using a current-magnetic field. A method according to this concept was already proposed, and there is a technique that uses a structure in which two ferromagnetic layers are separated by a semiconductor layer, as disclosed by Mattson et al., Phys. Rev. Lett. 71(1993) 185, for example.

This technique uses the fact that magnetic coupling between ferromagnetic layers depends on carrier concentration of a semiconductor layer interposed between them. In a multi-layered structure stacking such ferromagnetic/ semiconductor/ferromagnetic layers, magnetic coupling between ferromagnetic layers can be changed from parallel to anti-parallel, for example, by controlling carrier concentration of the semiconductor layer as the intermediate layer. Therefore, if the coercive force in one of the ferromagnetic layers (fixed layer) is set large, then magnetization of the other ferromagnetic layer (movable layer) can be rotated relative to the fixed layer. Such method of rotating magnetization through an electric input is hopeful as a technique for realizing a compact all-solid-state component.

In the above-mentioned multi-layered structure stacking ferromagnetic/semi-conductor/ferromagnetic layers, magnetic interaction occurs indirectly between the ferromagnetic layers via the semiconductor layer. In this case, the semiconductor layer as the intermediate layer must be sufficiently thin because intensity of interaction between the ferromagnetic layers via the semiconductor layer attenuates exponentially with the thickness of the semiconductor layer.

Assume here that, for the purpose of obtaining an actual intensity of interaction, a coercive force of 100 Oe (Oersted) is given by a method like exchange biasing in a nickel-iron alloy having the thickness of 2 nm and the saturated magnetization of 12500 G (Gauss), for example. In order to give an energy equivalent to an energy necessary for reversing magnetization of this nickel-iron alloy by indirect interaction via the semiconductor layer, it is estimated by simple calculation that the exchange coupling constant J must be at least 0.02 mJ(Joule)/m². Apparently, to ensure interaction not smaller than that value, thickness of the semiconductor layer as the intermediate layer must be 2.5 nm or less, as indicated by J. J. de Vries, Physical Review Letters 78(1997) 3023, for example. This is a term imposed to the semiconductor layer as the intermediate layer to provide a practical device.

On the other hand, in order to control magnetic coupling between the ferromagnetic layers by controlling carrier concentration of the semiconductor layer as the intermediate layer, an electrode has to be attached to the semiconductor layer in any appropriate manner for application of a voltage or injection of a current. Additionally, the device structure including this electrode must be optimized to effectively control carrier concentration of the semiconductor region between those two ferromagnetic regions (that serve as storage media). However, since thickness of the semiconductor layer must be 2.5 nm or less as explained above, it is difficult to actually fabricate such a device with existing fine processing techniques. Even if such a device can be made actually, since the semiconductor layer having that order of thickness is considered to form a substantial insulating barrier, it is extremely difficult to reflect modulation of the carrier concentration to the control of magnetic coupling.

OBJECT AND SUMMARY OF THE INVENTION

It is therefore an object of the invention to provide a magnetization control method capable of readily controlling magnetization without using a magnetic field, information storage method, magnetic functional device and information storage device using same.

According to the first aspect of the invention, there is provided a magnetization control method comprising:

placing a potential barrier region in direct or indirect contact with a region containing a magnetic element; and controlling magnetization of the region containing a magnetic body by modulating the potential barrier of the potential barrier region.

According to the second aspect of the invention, there is provided an information storage method comprising:

placing a potential barrier region in direct or indirect contact with a region containing a magnetic element;

controlling magnetization of the region containing a magnetic body by modulating the potential barrier of the potential barrier region; and storage of information being effected by using at least one of magnetization of the region containing a magnetic element.

According to the third aspect of the invention, there is provided a magnetic functional device comprising:

a structure including a potential barrier region placed in direct or indirect contact with a region containing a magnetic element, magnetization of the region containing a magnetic body being controlled by modulating the potential barrier of the potential barrier region.

According to the fourth aspect of the invention, there is provided an information storage device comprising:

a structure including a potential barrier region placed in direct or indirect contact with a region containing a magnetic element, magnetization of the region containing a magnetic body being controlled by modulating the potential barrier of the potential barrier region; and storage of information being effected by using at least one of magnetization of the region containing a magnetic element.

Typically, in the present invention, the region containing the magnetic body has a multi-layered structure in which a plurality of ferromagnetic layers are stacked and separated by an intermediate layer; the potential barrier region is a potential barrier layer located outside the multi-layered structure in the stacking direction; and relative arrangement of magnetization of the ferromagnetic layers in the region containing the magnetic body is controlled by controlling height and/or width of the potential barrier of the potential barrier layer. More specifically, for example, the region containing the magnetic body has a multi-layered structure in which a plurality of ferromagnetic metal layers are separated by a non-magnetic metal intermediate layer; the potential barrier region is a potential barrier layer formed along the interface with the semiconductor layer located outside the multi-layered structure in the stacking direction; and relative arrangement of magnetization of the ferromagnetic metal layers inside the region containing the magnetic body is controlled by controlling height and/or width of the potential barrier of the potential barrier layer by means of application of an electric field to the potential barrier layer. Alternatively, the region containing the magnetic body has a multi-layered structure in which a plurality of ferromagnetic layers are separated by a non-magnetic metal intermediate layer; the potential barrier region is a potential barrier layer consisting of an insulating layer located outside the multi-layered structure in the stacking direction; and relative arrangement of magnetization of the ferromagnetic metal layers inside the region containing the magnetic body is controlled by controlling height and/or width of the potential barrier of the potential barrier layer by means of application of an electric field to the potential barrier layer.

In the present invention, the region containing the magnetic body may be a single ferromagnetic layer; the potential barrier region may be a potential barrier layer arranged to contact the ferromagnetic layer via a non-magnetic layer having a thickness not thinner than a one atom layer; and direction of magnetization of the ferromagnetic layer may be controlled by controlling height and/or width of the potential barrier of the potential barrier layer. More specifically, for example, the region containing the magnetic body is a single ferromagnetic layer; the potential barrier region is a potential barrier layer formed along the interface with the semiconductor layer located in contact with the non-magnetic layer having a thickness not less than one atom layer; and direction of magnetization of the ferromagnetic layer is controlled by controlling the height and/or width of the potential barrier of the potential barrier layer by means of application of an electric field to the potential barrier layer. Alternatively, the region containing the magnetic body is a single ferromagnetic layer; the potential barrier region is a potential barrier layer consisting of an insulating layer located in contact with the ferromagnetic layer via a non-magnetic layer having a thickness not thinner than one atom layer; and direction of magnetization of the ferromagnetic layer is controlled by controlling the height and/or width of the potential barrier of the potential barrier layer by means of application of an electric field to the potential barrier layer.

In the present invention, usable as the magnetic functional element is a switching element similar to a field effect transistor (FET) using the phenomenon that the magnetic resistance varies with a voltage applied, for example. By using one or more switching elements, various circuits, including a logic circuit, for example, can be made.

In the present invention having the above-summarized-configuration, by modulation of the potential barrier of the potential barrier region arranged in direct or indirect contact with the region containing the magnetic element, quantum-mechanical reflectance of electrons along the interface between the region containing the magnetic body and the potential barrier region can be modulated. And, since interference of electron waves takes part in the magnetic interaction inside the region containing the magnetic element, magnetization of the region containing the magnetic body can be controlled through modulation of the quantum-mechanical reflectance. In this case, since the potential barrier region can be located outside the region containing the magnetic element, the electrode for input such as application of a voltage can be arranged easily. Therefore, magnetization of the region containing the magnetic body can be readily controlled without applying a magnetic field, and information can be stored by using at least one of magnetization of the region containing the magnetic element, for example.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
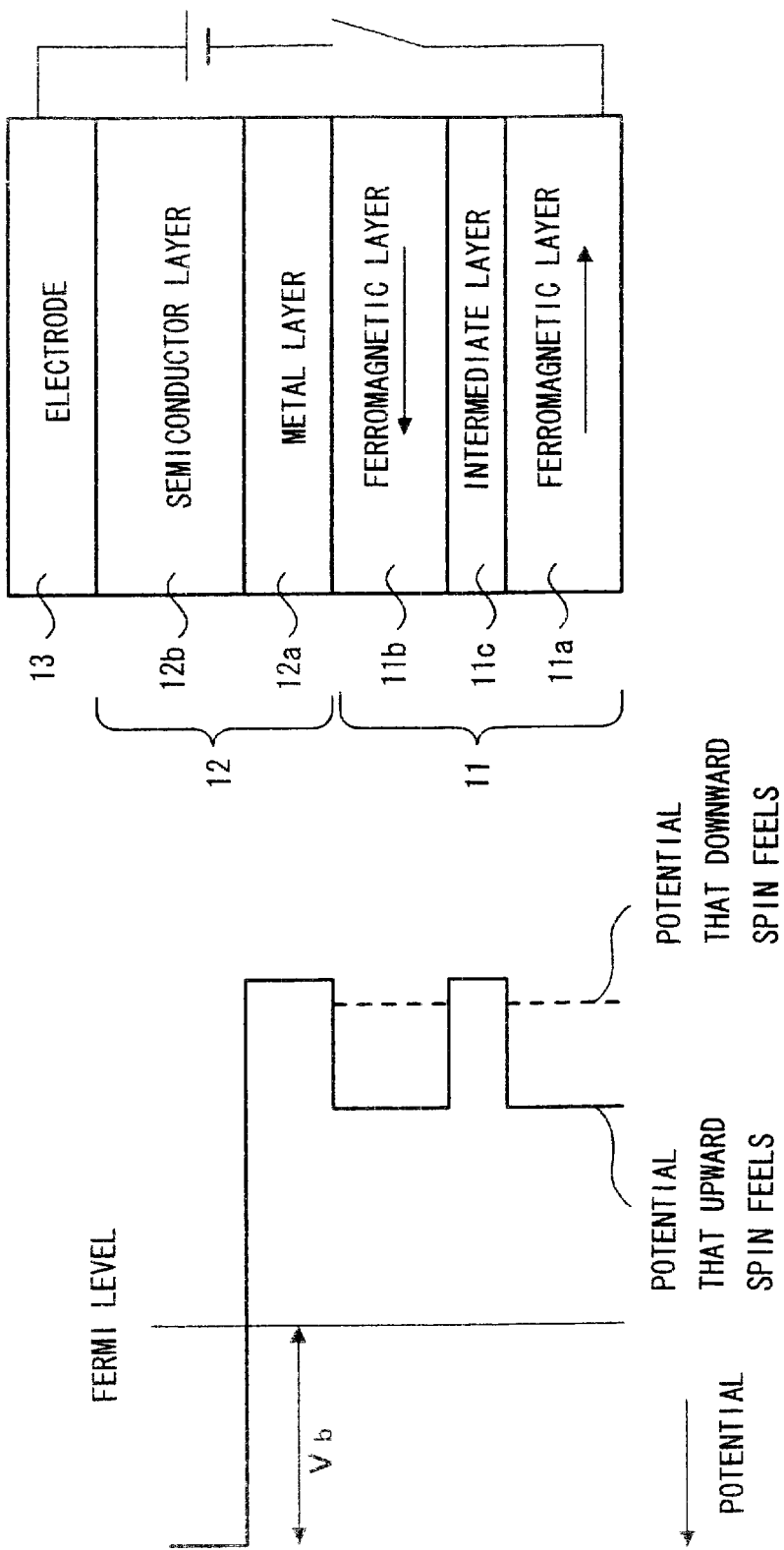
FIGS. 1A and 1B are a cross-sectional view showing a magnetic functional device according to the first embodiment of the invention, and its potential diagram before application of a voltage.

Some embodiments of the invention are explained below in detail with reference to the drawings.

FIGS. 1A and 1B show a magnetic functional device according to the first embodiment of the invention, in which FIG. 1A is a cross-sectional view of the magnetic functional device and FIG. 1B is an electron potential diagram of the magnetic functional device, keeping correspondence with FIG. 1A. In the potential diagram of FIG. 1B, the solid line is the potential that upward spin feels, and the broken line is the potential that downward spin feels. In portions such as the inside of a non-magnetic layer in which spin asymmetry does not exist in the potential, the potential is shown by a solid line.

In this first embodiment, a potential barrier region is arranged to be in direct or indirect contact with a region containing a magnetic element. That is, as shown in FIG. 1A, the region 11 containing the magnetic body has a multi-layered structure in which two ferromagnetic layers 11a, 11b are separated by a non-magnetic intermediate layer 11, and the potential barrier region 12 is composed of a metal layer 12a and a semiconductor layer 12b stacked on the surface of the region 11 containing the magnetic element.

Additionally, an electrode 13 is provided on the semiconductor layer 12b to apply an electric field necessary for modulating height and/or width of the potential barrier of the potential barrier region 12.

Figure 2:
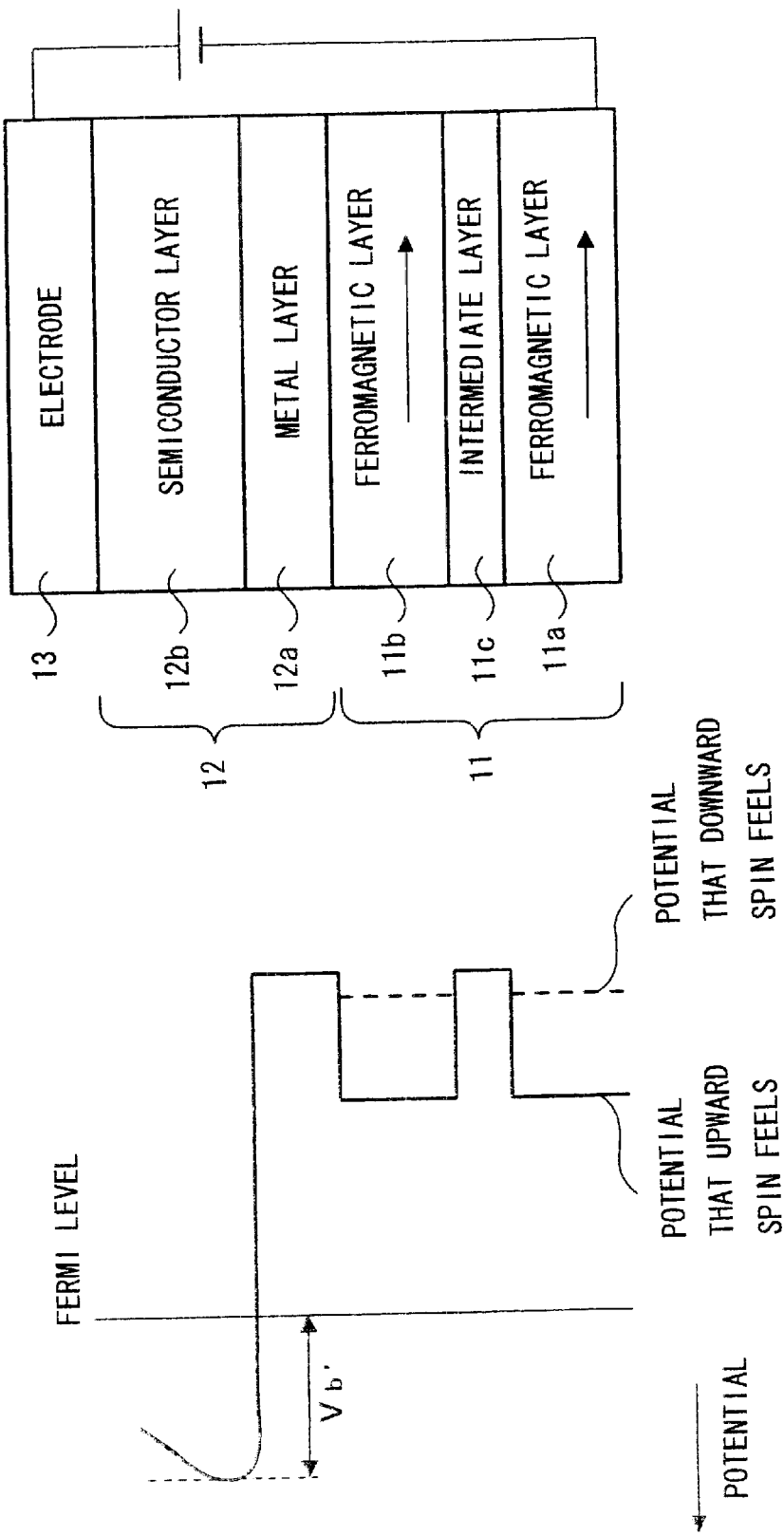
FIGS. 2A and 2B are a cross-sectional view showing the magnetic functional device according to the first embodiment of the invention, and its potential diagram after application of a voltage.

When a positive voltage is applied to the electrode 13 as shown in FIG. 2A, the corresponding potential diagram appears as shown in FIG. 2B. Responsively, a Schottky effect occurs, and the Schottky barrier, i.e. height of the potential barrier, along the interface between the region 11 containing the magnetic body and the potential barrier region 12 decreases From Vb before application of the voltage to Vb'. This magnetic functional device is characterized in reflecting a decrease in height of the potential barrier to modulation of the magnetic interaction inside the region 11 containing the magnetic element.

Explained below are fundamentals of the magnetic interaction of the region 11 containing the magnetic body being modulated by a decrease in height of the potential barrier.

It is widely known that, between ferromagnetic metal layers separated by a non-magnetic intermediate layer having the thickness of several nm, indirect magnetic interaction via the non-magnetic intermediate layer works. Intensity and sign (that determines which of parallel arrangement and anti-parallel arrangement is stable) of the magnetic interaction depends upon combination of the ferromagnetic material forming the ferroelectric metal layers and the non-magnetic material forming the non-magnetic metal intermediate layer, thickness, thickness of the non-magnetic metal intermediate layer, and so forth. For example, in FIG. 1A, the above-mentioned indirect magnetic interaction stabilizes magnetization of the ferromagnetic layers 11a, 11b when directions of their magnetization are in anti-parallel.

If the exchange coupling constant is J, it is known that J fluctuates not only with thickness of the non-magnetic metal intermediate layer but also with thickness of the ferromagnetic layers and thickness of a protective film located outside. Its origin is explained by using a quantum interference model (P. Bruno, Journal of magnetism and magnetic materials 121(1993) p. 248, for example). In a system including all of a non-magnetic metal intermediate layer, ferromagnetic layers, protective film, substrate, vacuum, and so on, Fermi surface electrons of the non-magnetic metal intermediate layer may produce standing waves that mutually strengthen by multiple interaction due to quantum-mechanical reflection at interfaces of respective layers. However, this means an increase of the total energy. Since electron potential in the ferromagnetic layers vary with the spin direction, there are different conditions for producing standing waves between parallel arrangement and anti-parallel arrangement of the ferromagnetic layers, and one of them more stable in energy is determined. Since conditions of producing standing waves are conditions for matching phases and are established with thickness of the layer, J varies with thickness of the layer.

However, since thickness of the layer is difficult to modulate with external stimulation, change of J with thickness of the layer is difficult to use for modulation of magnetic interaction. Therefore, it is necessary to control another parameter determining the phase matching conditions. The first embodiment shown here is configured to modulate the phase matching condition in multiple interaction by modulating quantum-mechanical reflectance of electrons.

That is, by modulating the potential barrier of the potential barrier region 2 in FIG. 1, quantum-mechanical reflectance of electrons at the interface between the region 11 containing the magnetic body and the potential barrier region 12 is modulated. Since magnetic interaction inside the region 11 containing the magnetic body is affected by interference of the total system including the exterior of the region 11 containing the magnetic element, changes in quantum-mechanical reflectance outside the region 11 containing the magnetic body can be also used for modulation of the magnetic interaction.

Figure 3:
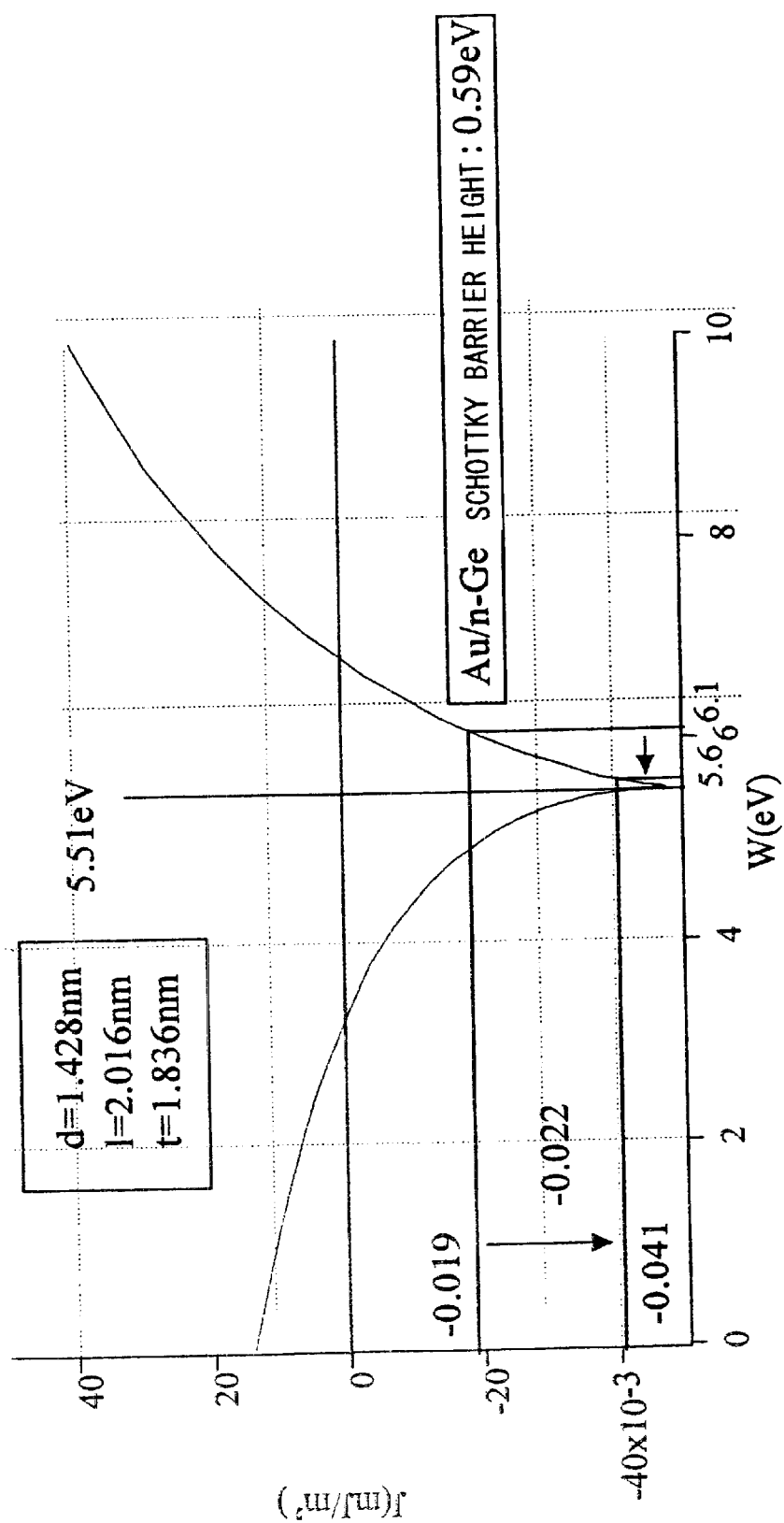
FIG. 3 is a schematic diagram for explaining operation of the magnetic functional device according to the first embodiment of the invention.

Shown in FIG. 3 is a result of calculation of changes in intensity of J obtained by modulation of height and/or width of the potential barrier in the first embodiment. The ordinate of FIG. 3 shows the exchange coupling constant J and the abscissa shows height W of the potential barrier measured with reference to the metal layer 12a. Here is used Fe layers as the ferromagnetic layer 11a, 11b and Au layers as the intermediate layer 11c and the metal layer 12a, in which thickness d of the intermediate layer 11c is d=1.428 nm, thickness 1 of the ferromagnetic layers 11a, 11b is 1=2.016 nm, and thickness t of the metal layer 12a is t=1.836 nm. Further, an n-type Ge layer is used as the semiconductor layer 12b. In this case, height of the Schottky barrier at the interface between the metal layer 12a and the semiconductor layer 12b is 0.59 eV. As shown in FIG. 3, although W=6.1 eV before application of a voltage to the electrode 13, and J=0.019 mJ/m$^2$ at that time, after the voltage of 13.8 V is applied to the electrode 13, W=5.6 eV, and J=−0.041 mJ/m$^2$ at that time. Thus, the change of J before and after application of the voltage is −0.022 mJ/m$^2$. This is large enough to cause magnetization inversion.

As explained above, according to the first embodiment, the potential barrier region 12 is provided in contact with the region 11 containing the magnetic element, the potential barrier of the potential barrier region 12 is modulated by applying a voltage to the electrode 13, and magnetization of the region 11 containing the magnetic element, which is, more particularly, magnetization of the ferromagnetic layer 11b, is controlled by that modulation. Therefore, magnetization of the ferromagnetic layer 11b can be readily controlled without using a magnetic field as used conventionally. In this case, since the potential barrier region 12 may be located outside the region 11 containing the magnetic element, the electrode 13 for input by application of a voltage can be easily located in place.

Figure 4:
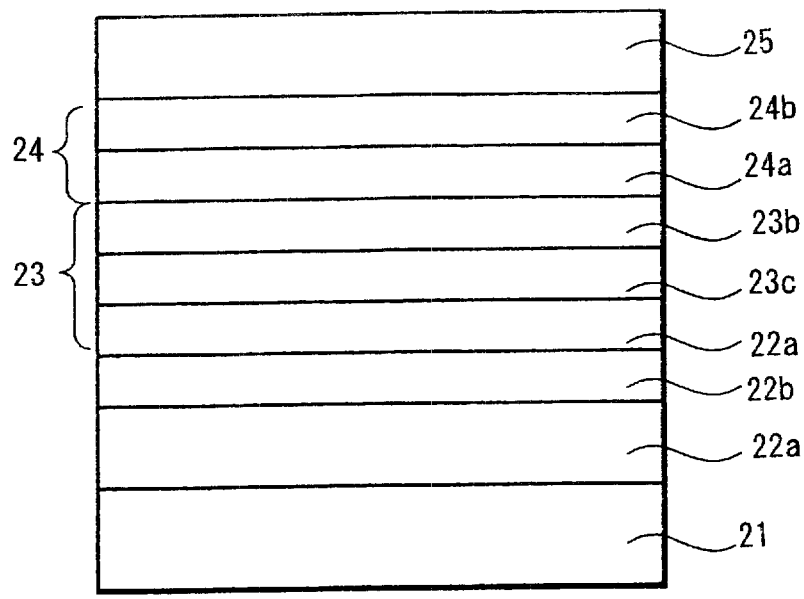
FIG. 4 is a cross-sectional view showing a magnetic functional device according to the second embodiment of the invention.

FIG. 4 shows a magnetic functional device according to the second embodiment of the invention. The second embodiment is directed to a more concrete example of the configuration of the magnetic functional device according to the first embodiment.

As shown in FIG. 4, in this magnetic functional device, a region 23 containing a magnetic body consisting of a multi-layered structure including two ferromagnetic layers 23a, 23b separated by a non-magnetic intermediate layer 23c is provided on a substrate 21 via base layers 22a, 22b, a potential barrier region 24 made up of a metal layer 24a and a semiconductor layer 24b is provided thereon, and an electrode 25 is formed thereon.

Usable as the substrate 21 are, for example, a magnesium oxide (MgO) substrate, sapphire substrate, glass substrate, silicon substrate, plastic substrate, etc. A silver (Ag) film, for example, may be used as the base layer 22a in combination of a gold (Au) film, for example, as the base layer 22b. Although these base layers 22a, 22b assist good growth of upper layers, they may be omitted if so desired. These base layers 22a, 22b can be used as lower electrodes as well. Usable as the ferromagnetic layers 23a, 23b are, for example, iron (Fe), cobalt (Co), nickel (Ni), their alloys, and alloys containing any of these elements. As the non-magnetic intermediate layer 23c, appropriate one is used selected and used from precious metals or transition metals such as gold (Au), silver (Ag), copper (Cu), chromium (Cr), ruthenium (Ru), aluminum (Al) and others so as to make a combination producing indirect magnetic interaction between the ferromagnetic layers 23a and 23b. As the metal layer 24a and the semiconductor layer 24b forming the potential barrier region 24, a combination of materials forming a Schottky barrier, such as gold (Au) and germanium (Ge) (especially those of n-type), for example, is used.

In a typical example, the substrate 21 is a 500 μm thick MgO substrate, the base layer 22a is a 150 nm thick Ag film, the base layer 22b is a 16 nm thick Au film, the ferromagnetic layers 29a, 23b are 2 nm thick Fe films, the non-magnetic intermediate layer 23c is 1.4 nm Au film, the metal layer 24a is a 1.8 nm thick Au film, the semiconductor layer 24b is a 5 nm thick n-type Ge film, and the electrode 15 is a 100 nm thick Al film.

Figure 5:
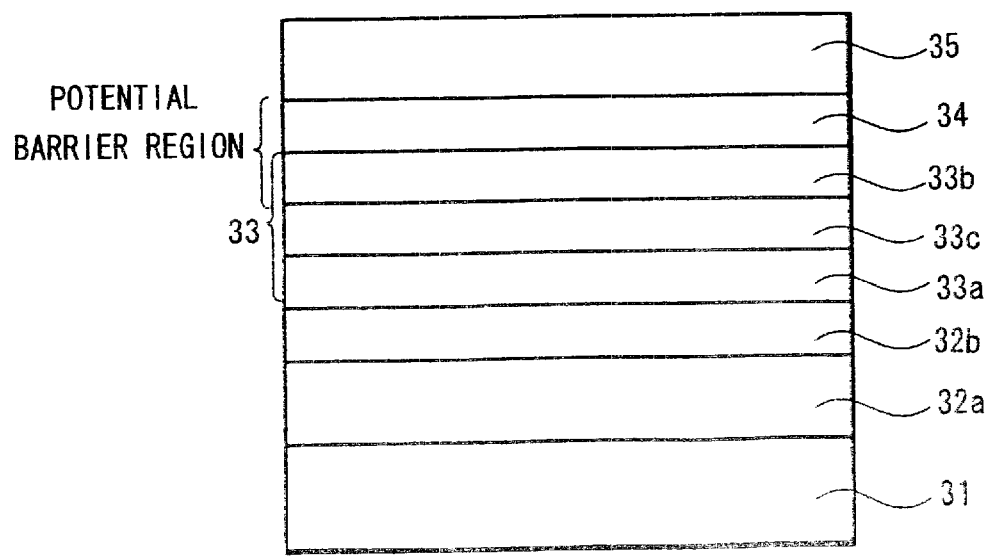
FIG. 5 is a cross-sectional view showing a magnetic functional device according to the third embodiment of the invention.

FIG. 5 shows a magnetic functional device according to the third embodiment of the invention.

This magnetic functional device corresponds to a version omitting the metal layer 24a from the magnetic functional device according to the second embodiment. That is, as shown in FIG. 5, in this magnetic functional device, a region 33 containing a magnetic body consisting of a multi-layered structure made of two ferromagnetic layers 33a, 33b separated by a non-magnetic intermediate layer 33c is formed on a substrate 31 via base layers 32a, 32b; a semiconductor layer 34 is formed thereon; and an electrode 35 is provided thereon. In this case, a Schottky barrier is produced between the ferromagnetic layer 33b and the semiconductor layer 34, and these ferromagnetic layer 33b and semiconductor layer 34 form the potential barrier region.

As the substrate 31, base layers 32a, 32b, ferromagnetic layers 33a, 33b, non-magnetic intermediate layer 33c, semiconductor layer 34 and electrode 35, the same materials as those of the second embodiment can be used.

Figure 6:
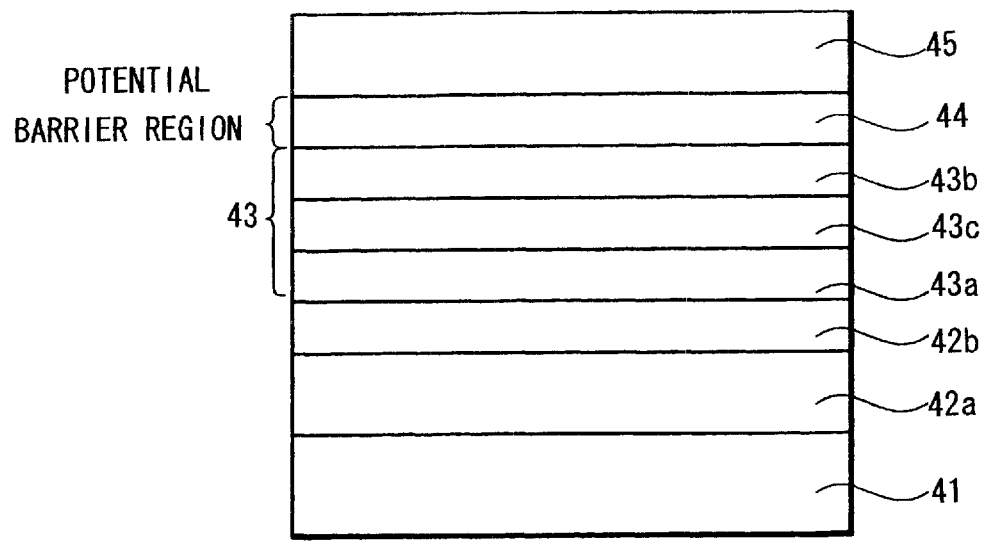
FIG. 6 is a cross-sectional view showing a magnetic functional device according to the fourth embodiment of the invention.

FIG. 6 shows a magnetic functional device according to the fourth embodiment of the invention.

This magnetic functional device corresponds to a version using an insulating barrier in lieu of the Schottky barrier by the metal 24a and the semiconductor layer 24b in the magnetic functional device according to the second embodiment. More specifically, as shown in FIG. 6, in the magnetic functional device shown here, a region 43 containing a magnetic body consisting of a multi-layered film made up of two ferromagnetic layers 43a, 43b separated by a non-magnetic intermediate layer 43c on a substrate 41 via base layers 42a, 42b; an insulating layer 44 is stacked thereon; and an electrode 45 is provided thereon. In this case, the insulating layer forms the potential barrier region.

As the substrate 41, base layers 42a, 42b, ferromagnetic layers 43a, 43b, non-magnetic intermediate layer 43c, and electrode 45, the same materials as those of the second embodiment can be used. Usable as the insulating film 44 are, for example, an aluminum oxide film ($Al_2O_3$), cerium oxide ($CeO_2$), magnesium oxide (MgO), hafnium oxide ($HfO_2$) and tantalum oxide ($TaO_2$), for example.

Figure 7:
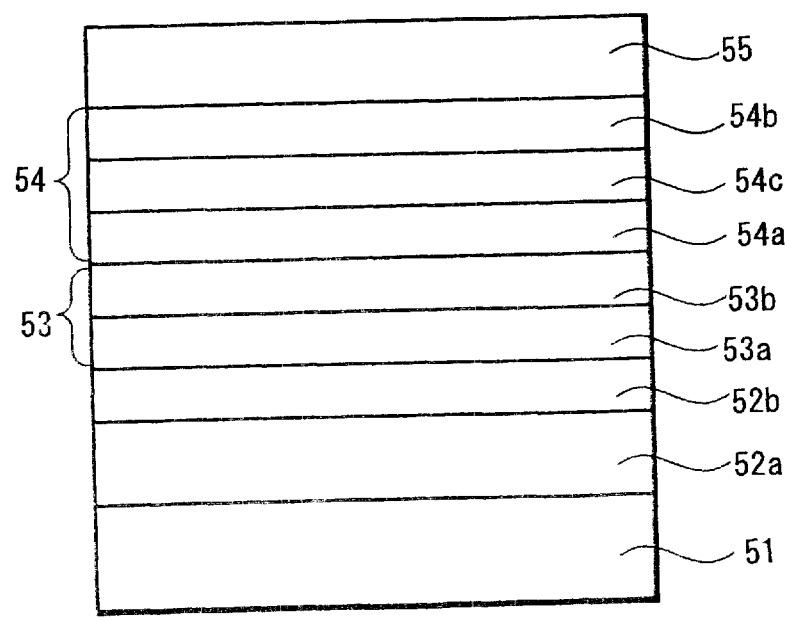
FIG. 7 is a cross-sectional view showing a magnetic functional device according to tile fifth embodiment of the invention.

FIG. 7 shows a magnetic functional device according to the fifth embodiment of the invention.

This magnetic functional device corresponds to a version vertically reversing the region 23 containing the magnetic body and the potential barrier region 24 in the second embodiment and locating the potential barrier region nearer to the substrate. More specifically, as shown in FIG. 7, in this magnetic functional device, a potential barrier region 53 made up of a semiconductor layer 53a and a metal layer 53b is formed on a substrate 51 via base layers 52a, 52b; and a region 54 containing a magnetic body consisting of a multi-layered structure including two ferromagnetic layers 54a, 54b separated by a non-magnetic intermediate layer 54c is provided thereof; and an electrode 55 is provided thereon.

As the substrate 51, base layers 52a, 52b, metal layer 53b, ferromagnetic layers 54a, 54b, non-magnetic intermediate layer 54c, and electrode 55, the same materials as those of the second embodiment can be used.

Figure 8:
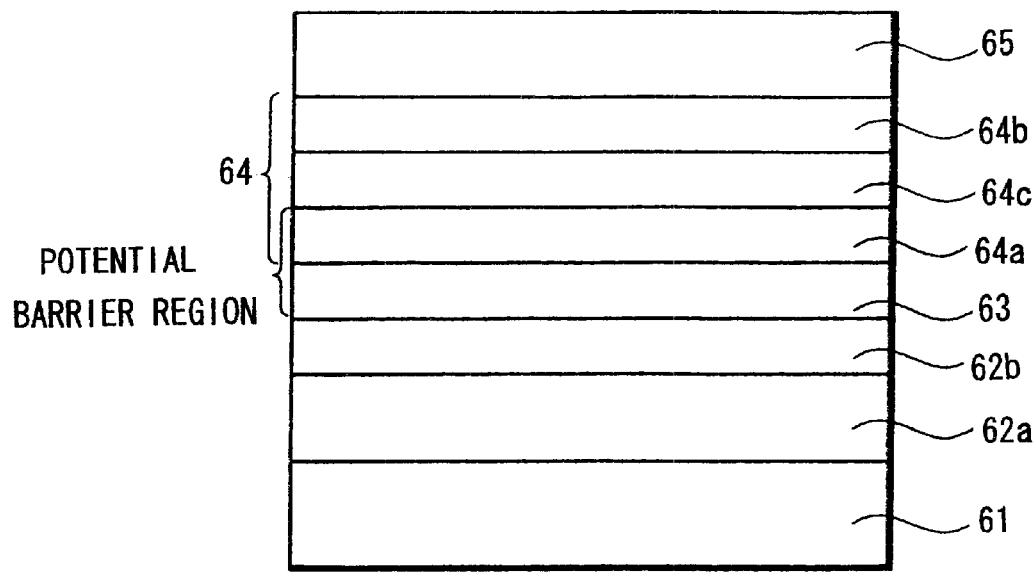
FIG. 8 is a cross-sectional view showing a magnetic functional device according to the sixth embodiment of the invention.

FIG. 8 shows a magnetic functional device according to the sixth embodiment of the invention.

This magnetic functional device corresponds to a version omitting the metal layer 53a from the magnetic functional device according to the fifth embodiment. More specifically, as shown in FIG. 8, in this magnetic functional device, a semiconductor layer 63 is stacked on the substrate 61 via base layers 62a, 62b; a region 64 containing a magnetic body consisting of a multi-layered structure made up of two ferromagnetic layers 64a, 64b separated by a non-magnetic intermediate layer 64c is formed thereon; and an electrode 65 is provided thereon. In this case, a Schottky barrier is produced between the semiconductor layer 63 and the ferromagnetic layer 64a, and these semiconductor layer 63 and ferromagnetic layer 64a form the potential barrier region.

As the substrate 61, base layers 62a, 62b, semiconductor layer 63, ferromagnetic layers 64a, 64b, non-magnetic intermediate layer 64c, and electrode 65, the same materials as those of the second embodiment can be used.

Figure 9:
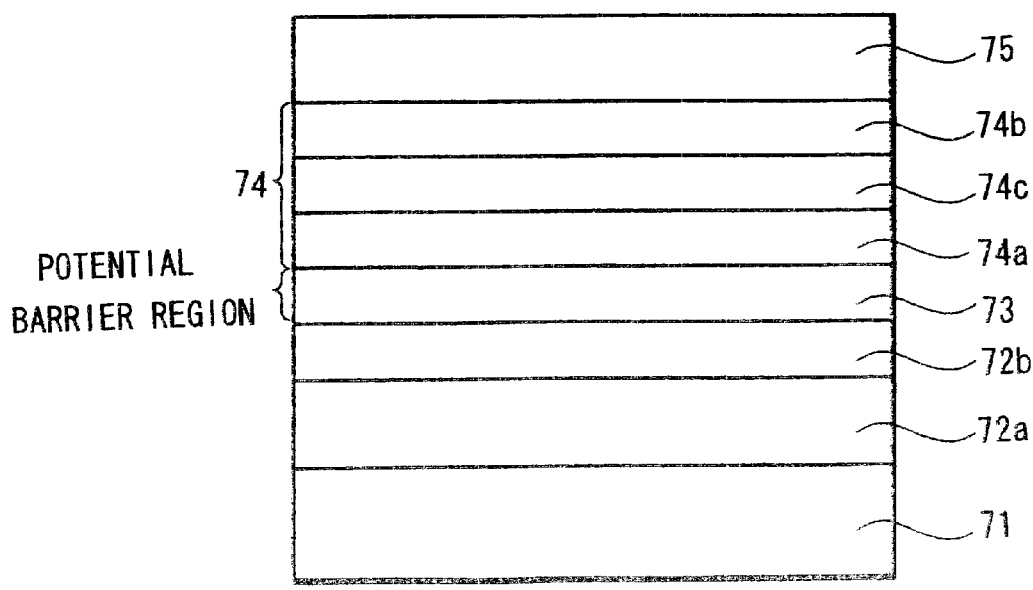
FIG. 9 is a cross-sectional view showing a magnetic functional device according to the seventh embodiment of the invention.

FIG. 9 shows a magnetic functional device according to the sixth embodiment of the invention.

This magnetic functional device corresponds to a version using an insulating barrier in lieu of the Schottky barrier by the metal layer 53b and the semiconductor layer 53a in the magnetic functional device according to the fifth embodiment. More specifically, as shown in FIG. 9, in this magnetic functional device, an insulating layer 73 is stacked on a substrate 71 via base layers 72a, 72b; a region 74 containing a magnetic body consisting of a multi-layered structure made up of two ferromagnetic layers 74a, 74b separated by a non-magnetic intermediate layer 64c is formed thereon; and an electrode 75 is provided thereon. In this case, the insulating layer 73 serves as the potential barrier region.

As the substrate 71, base layers 72a, 72b, ferromagnetic layers 74a, 74b, non-magnetic intermediate layer 74c, and electrode 75, the same materials as those of the second embodiment can be used. Usable as the insulating layer 73 are the same materials as used in the fourth embodiment.

Figure 10A:
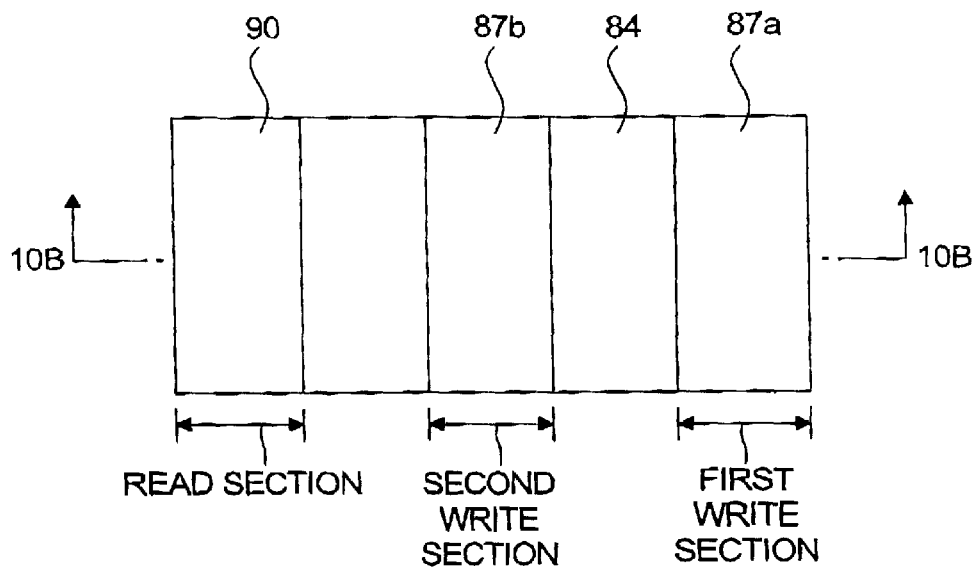
FIGS. 10A and 10B are a plan view and a cross-sectional view showing an information storage device according to the eighth embodiment of the invention.
Figure 10B:
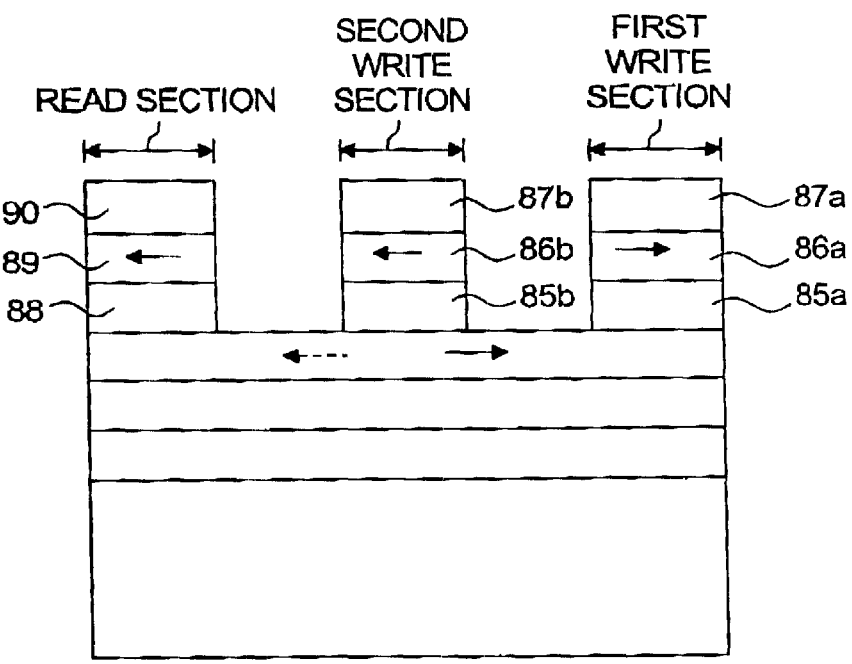

FIGS. 10A and 10B show an information storage device according to the eighth embodiment of the invention, and illustrate a single memory cell thereof. FIG. 10A is a plan view, and FIG. 10B is a cross-sectional view taken along the 10B—10B line of FIG. 10A.

Similarly to the magnetic functional devices according to the fifth to seventh embodiments, the information storage device shown here has a structure locating the potential barrier region nearer to the substrate. More specifically, as shown in FIGS. 10A and 10B, in this information storage device, a lower electrode 82, semiconductor layer 83 and soft-magnetic layer 84 having uniaxial magnetic anisotropy are sequentially stacked on a substrate 81. Any of the materials proposed in the explanation of the second embodiment is usable as the substrate 81. The lower electrode 82 and the semiconductor layer 83 form the potential barrier region. The lower electrode 82 and the semiconductor layer 83 are made of materials that produce a Schottky barrier between them. For example, the lower electrode 82 is made of Au, and the semiconductor layer 83 is made of n-type Ge. Sequentially stacked on a predetermined location of the soft-magnetic layer 84 are a non-magnetic intermediate layer 85a patterned into a predetermined geometry, a hard-magnetic layer 86a and an upper electrode 87a to form a first write section. Sequentially stacked on a location of the soft-magnetic layer 84 adjacent to the first write section are a non-magnetic intermediate layer 85b patterned into a predetermined geometry, hard-magnetic layer 86b and upper electrode 87b to form a second write section. In the first write section, the multi-layered structure in which the soft-magnetic layer 84 and the hard-magnetic layer 86a is separated by the non-magnetic intermediate layer 85a forms the region containing the magnetic element. Similarly, in the second write section, the multi-layered structure in which the soft-magnetic layer 84 and the hard-magnetic layer 86b is separated by the non-magnetic intermediate layer 85b forms the region containing the magnetic element.

Further stacked sequentially on the soft-magnetic layer 84 are an insulating layer 88 patterned into a predetermined geometry, a hard-magnetic layer 89 and an upper electrode 90 to form a read section adjacent to the second write section. In this case, the insulating layer 88 and the hard-magnetic layer 89 make a ferromagnetic tunneling junction of the read section.

The hard-magnetic layers 86a, 86b and 89 have a large coercive force, and are fixed in magnetization. The soft-magnetic layer 84 has a coercive force smaller than those of the hard-magnetic layers 86a, 86b and 89. Material of the soft-magnetic layer 84 may be, for example, Permalloy (Fe—Ni alloy), and material of the hard-magnetic layers 86a, 86b and 89 may be, for example, Co—Pt alloy.

In the information storage device shown here, thickness and other factors of the non-magnetic intermediate layers 85a and 85b are selected such that magnetic interaction between the soft-magnetic layer 84 and the hard-magnetic layer 86a in the first write section or magnetic interaction between the soft-magnetic layer 84 and the hard-magnetic layer 86b in the second write section can be controlled by applying a voltage between the lower electrode 82 and the upper electrode 87a or 87b and thereby modulating the potential barrier of the potential barrier region made up of the lower electrode 82 and the semiconductor layer 83.

Next explained is a method of writing and reading (reproducing) information in and from this information storage device. Assume here that, as shown in FIG. 10B, the hard-magnetic layer 86a in the first write section has rightward fixed magnetization whereas the hard-magnetic layer 86b in the second write section has leftward fixed magnetization. When the magnetization of the soft-magnetic layer 84 is oriented rightward in the drawing, let it correspond to information "1". When it is oriented leftward, let it correspond to information "0". Needless to say, correspondence of information and orientation of magnetization may be opposite from it. Further assume that the hard-magnetic layer 89 in the read section has leftward fixed magnetization in the drawing.

First explained is a method for writing information. For writing information "1" in the memory cell, a voltage is applied between the upper electrode 87a and the lower electrode 82 in the first write section such that the exchange coupling constant J between the soft-magnetic layer 84 and the hard-magnetic layer 86a becomes not smaller than 0.02 mJ/m². Responsively, magnetization of the soft-magnetic layer 84 aligns with magnetization of the hard-magnetic layer 86a and is oriented rightward in the drawing. As a result, information "1" is written in the memory cell. For writing information "0" in the memory cell, a voltage is applied between the upper electrode 87b and the lower electrode 82 in the second write section such that the exchange coupling constant J between the soft-magnetic layer 84 and the hard-magnetic layer 86b becomes not smaller than 0.02 mJ/m². Responsively, magnetization of the soft-magnetic layer 84 aligns with magnetization of the hard-magnetic layer 86b, and it is oriented leftward. As a result, information "0" is written in the memory cell.

Next explained is a method of reading information. Reading uses the fact that there is a difference in the current flowing upon application of a voltage between the upper electrode 87a in the first write section or the upper electrode 87b in the second write section and the upper electrode 90 in the read section, depending upon whether the magnetization of the soft-magnetic layer 84 is oriented rightward or leftward in FIGS. 10A and 10B. That is, depending upon whether the magnetization of the soft-magnetic layer 84 is oriented rightward or leftward in FIGS. 10A and 10B, resistance of the ferromagnetic tunneling junction made by the insulating film 88 and the ferromagnetic layer 89 is different, and the value of the flowing current is different. Therefore, by detecting values of the current with a sense amplifier (not shown), for example, information stored in the memory cell can be read out.

According to the information storage device of the eighth embodiment, information can be written by controlling magnetization without using a magnetic field, and reading of information, as well, can be effected by detecting the current. This information storage device capable of controlling magnetization without using a magnetic field contributes to realization of highly ideal solid-state memory which is short in access time, easy in high integration, nonvolatile, increased in number of events of rewriting, and free from cross-talk, for example.

Figure 11A:
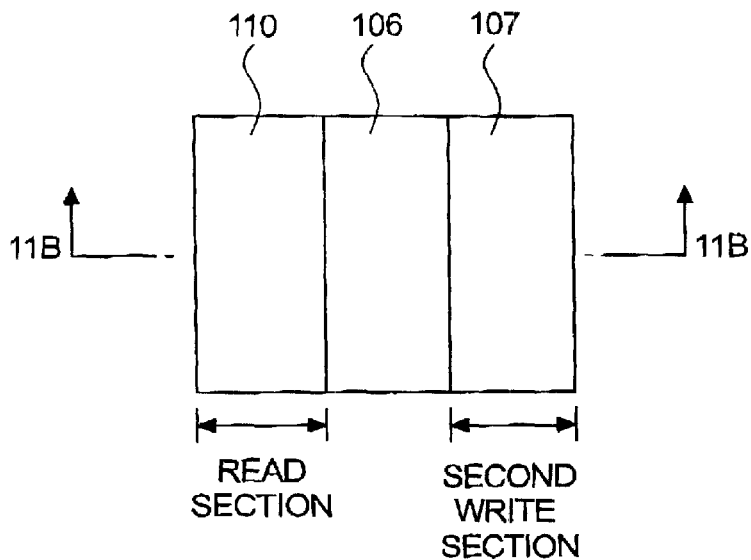
FIG. 11 is a cross-sectional view showing an information storage device according to the ninth embodiment of the invention.
Figure 11B:
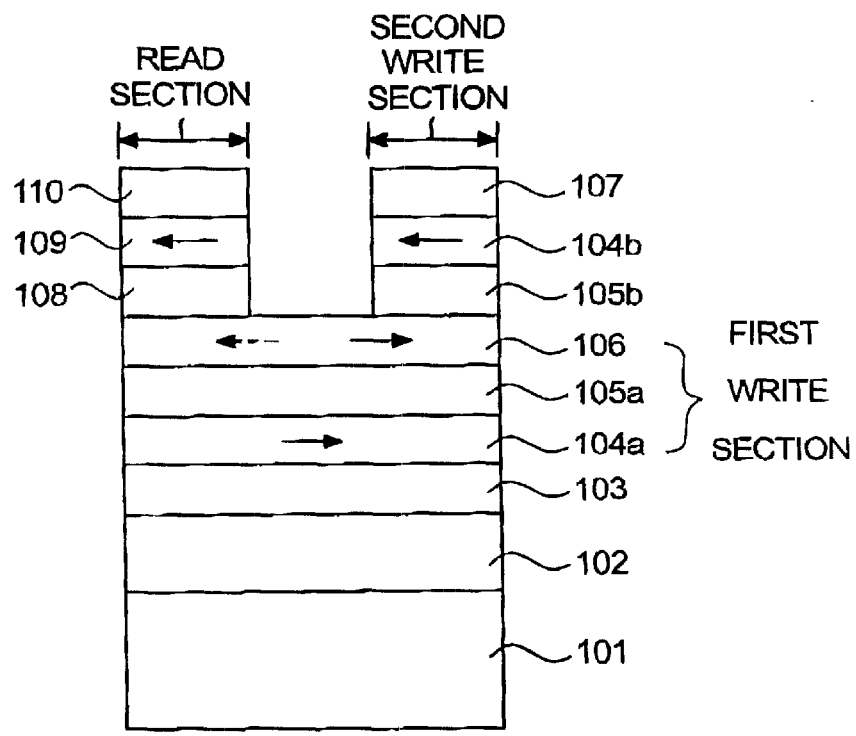

FIGS. 11A and 11B show an information storage device according to the eighth embodiment of the invention, and illustrate a single memory cell thereof. FIG. 11A is a plan view, and FIG. 11B is a cross-sectional view taken along the 11B—11B line of FIG. 11A.

The information storage device shown here corresponds to a version modified from the information storage device according to the eighth embodiment by locating the hard-magnetic layer in the first write section between the soft-magnetic layer and the semiconductor layer and stacking the second write section on the first write section. More specifically, as shown in FIG. 11A and 11B, in this information storage device, a lower electrode 102, semiconductor layer 103, hard-magnetic layer 104a, non-magnetic intermediate layer 105a and soft-magnetic layer 106 having uni-axial magnetic anisotropy are sequentially stacked on a substrate 101. The lower electrode 102 and the semiconductor layer 103 make up the potential barrier region. The lower electrode 102 and the semiconductor layer 103 are made of materials that make a Schottky barrier therebetween. For example, the lower electrode 102 is made of Au, and the semiconductor layer 103 is made of n-type Ge. The hard-magnetic layer 104a, intermediate layer 105a and soft-magnetic layer 106 make up a first write section. On a predetermined location of the soft-magnetic layer 106, a non-magnetic intermediate layer 105b patterned into a predetermined geometry, hard-magnetic layer 104b, and upper electrode 107 are sequentially stacked to make up a second write section. In the first write section, a multi-layered structure composed of the hard-magnetic layer 104a and the soft-magnetic layer 106 separated by the non-magnetic intermediate layer 105a forms the region containing a magnetic element. Similarly, in the second write section, a multi-layered structure composed of the soft-magnetic layer 106 and the hard-magnetic layer 104b separated by the non-magnetic intermediate layer 105b forms the region containing a magnetic element.

Further stacked sequentially on the soft-magnetic layer 106 are an insulating layer 108 patterned into a predetermined geometry, a hard-magnetic layer 109 and an upper electrode 110 to form a read section adjacent to the second write section. In this case, the insulating layer 108 and the hard-magnetic layer 109 make a ferromagnetic tunneling junction of the read section.

The hard-magnetic layers 104a, 104b and 109 have a large coercive force, and are fixed in magnetization. The soft-magnetic layer 106 has a coercive force smaller than those of the hard-magnetic layers 104a, 104b and 109. Material of the soft-magnetic layer 104 may be, for example, Permalloy (Fe—Ni alloy), and material of the hard-magnetic layers 104a, 104b and 109 may be, for example, Co—Pt alloy.

In the information storage device shown here, unlike the information storage device according to the eighth embodiment, direction of magnetization of the soft-magnetic layer 106 cannot be selected by selecting one of the electrodes in the first write section and the second write section. Therefore, thickness of the intermediate layer 105a is designed to enable control of magnetic interaction between the hard-magnetic layer 104a and the soft-magnetic layer 106 by means of the potential of the lower electrode 102 alone, and thickness of the intermediate layer 105b is designed to enable magnetic interaction between the hard-magnetic layer 104b and the soft-magnetic layer 106 only when applying potentials to both the lower electrode 102 and the upper electrode 107.

A method for writing and reading information in and from this information storage device, may be the same as the method according to the eighth embodiment except for the above-mentioned points. Explanation thereof is therefore omitted here.

According to the ninth embodiment, the same advantages as those of the eighth embodiment can be obtained. Additionally, since the second write section is stacked on the first write section, area occupied by each memory cell can be reduced, and it is more advantageous for higher integration of memory cells.

Figure 12:
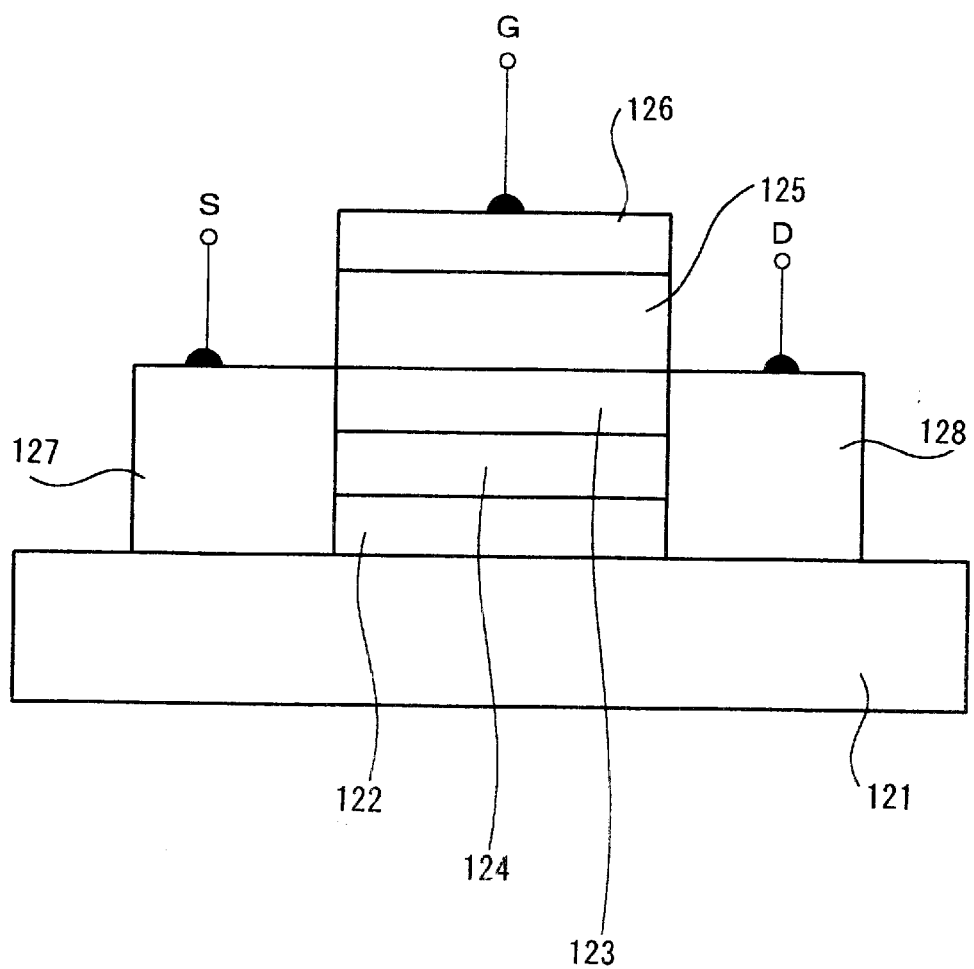
FIG. 12 is a cross-sectional view showing a transistor according to the tenth embodiment of the invention.

FIG. 12 shows a transistor according to the tenth embodiment of the invention. This transistor is a magnetic functional device using the fact that magnetic resistance varies with application of a voltage.

As shown in FIG. 12, in the transistor, a region containing a magnetic body consisting of a multi-layered structure made up of two ferromagnetic layers 122, 123 separated from a non-magnetic intermediate layer 124 is provided on a substrate 121; a gate insulating film 125 is provided thereon, and a gate electrode 126 is further provided thereon. In this case, the gate insulating film 125 forms the potential barrier region. At opposite sides of the region containing a magnetic element, a source electrode 127 and a drain electrode 128 are formed in electrical contact with the multi-layered structure in which two ferromagnetic layers 122, 123 are separated by the non-magnetic intermediate layer 124.

Usable as the substrate 121, ferromagnetic layers 122, 123 and non-magnetic intermediate layer 124 are those used in the second embodiment to make its substrate 41, ferromagnetic layers 43a, 43b and non-magnetic intermediate layer 43c. Similarly, usable as the gate electrode 126 are those recommended in the second embodiment as material of its electrode 45. Further, the gate insulating film 125 may be made of any of the materials recommended in the fourth embodiment to make the insulating layer 44. The multi-layered structure composed of the ferromagnetic layers 122, 123 and the non-magnetic intermediate layer 124 is stacked on the substrate 121 preferably via a base layer, and usable as the base layer are those raised in the second embodiment as materials of its base layers 42a, 42b.

In the transistor shown here, inter-layer exchange coupling operates between the ferromagnetic layers 122 and 123 via the non-magnetic intermediate layer 124. Therefore, when a positive voltage is applied to the gate electrode 126, a Schottky effect occurs along the interface between the gate insulating film 125 and the ferromagnetic layer 123, and magnetic exchange coupling in the multi-layered structure stacking the ferromagnetic layers 122, 123 via the non-magnetic intermediate layer 124 is controlled. As a result, relative angle between magnetization of the ferromagnetic layer 122 and magnetization of the ferromagnetic layer 123 varies, and magnetic resistance also varies accordingly. Taking it into consideration, if a positive voltage is applied to the drain electrode 128 relative to the source electrode 127, relative angle of magnetization in the multi-layered structure stacking the ferromagnetic layers 122, 123 via the non-magnetic intermediate layer 124 varies depending upon the presence or absence of the gate voltage 0 or +V), and a resulting change in magnetic resistance causes a change in drain current. In this manner, current modulation can be effected by voltage input.

According to the tenth embodiment, unlike conventional FETs, a transistor can be made up of a metal and an insulator alone, and microminiaturization can be expected. Additionally, unlike spin transistors already reported, this is a realistic device, and its configuration using no current-magnetic field enables higher integration.

The methods used in the first and tenth embodiments, namely, methods which employ modulation of the surface barrier height (i.e., modulation of quantum-mechanical reflectance of electrons on a surface) to control a stable state of a system determined by interference of electron waves, can be also used for purposes other than control of indirect magnetic interaction between magnetic layers as explained above. More specifically, this method can be used for controlling magnetic anisotropy as well. This is explained below.

It is already known that magnetic anisotropy of a magnetic thin film may possibly change in an oscillatory mode with respect to a non-magnetic layer stacked thereon (C. H. Back et al, Journal of Applied Physics 81(1997) 5054). The origin of this phenomenon is believed to be the same as the oscillatory phenomenon of indirect magnetic interaction between magnetic layers. That is, conditions for phase matching in interference of electron waves in the non-magnetic layer are established in an oscillatory mode, and this causes the band structure of electrons along the interface between the magnetic layer and the non-magnetic layer through changes in state density, and leads to oscillatory modulation of the magnetic anisotropy.

On the other hand, phase matching conditions can be controlled by modulating the potential barrier at the surface of a non-magnetic layer as already stated above. Therefore, similarly to indirect magnetic interaction, magnetic anisotropy can be controlled with a voltage by using a Schottky effect, for example.

Explained below is a magnetic functional device according to an embodiment using this technique of controlling magnetic anisotropy by means of a voltage.

Figure 13:
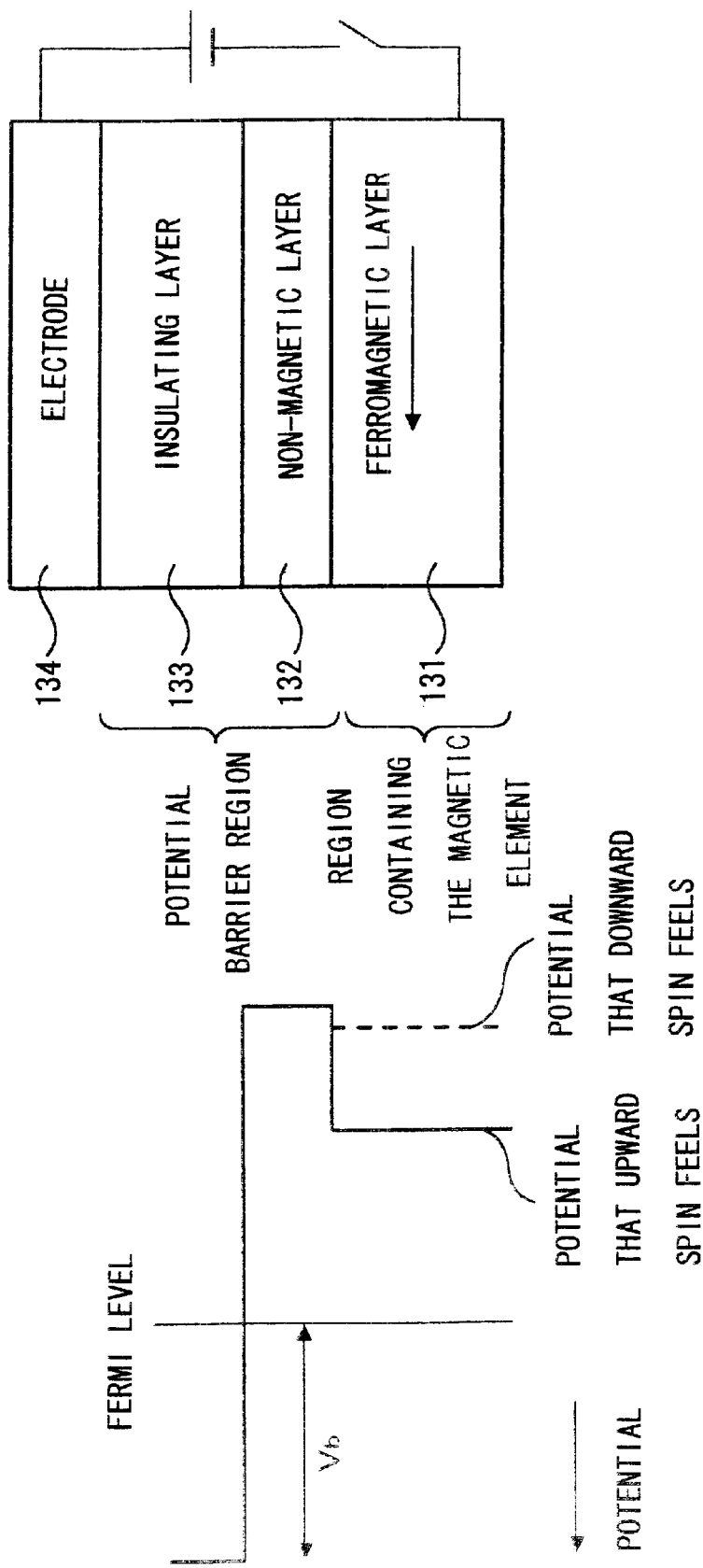
FIGS. 13A and 13B are a cross-sectional view showing a magnetic functional device according to the eleventh embodiment of the invention, and its potential diagram before application of a voltage.

FIGS. 13A and 13B show the magnetic functional device as the eleventh embodiment of the invention. FIG. 13A is a cross-sectional view of the magnetic functional device, and FIG. 13B is an electron potential diagram of the magnetic functional device, keeping correspondence with FIG. 13A. In the potential diagram of FIG. 13B, the solid line is the potential that upward spin feels, and the broken line is the potential that downward spin feels. In portions such as the inside of a non-magnetic layer in which spin asymmetry does not exist in the potential, the potential is shown by a solid line.

In the eleventh embodiment, the potential barrier region is located to indirectly contact the region containing a magnetic layer via a non-magnetic layer. More specifically, as shown in FIG. 13A, a ferromagnetic layer 131 constitutes the region containing a magnetic element, and a non-magnetic layer 132 is stacked on its surface. The potential barrier region used here is an insulating layer 133 stacked on the surface of the non-magnetic layer 132. An electrode 134 is formed on the insulating layer 133 for the purpose of applying an electric field required for modulating height and/or width of the potential barrier of the insulating film 133 as the potential barrier region.

If a positive voltage is applied to the electrode 134 as shown in FIG. 13A, then the corresponding potential diagram is as shown in FIG. 13B. Responsively, a Schottky effect occurs, and height of the potential barrier, along the interface between the non-magnetic layer 132 and the potential barrier region decreases from Vb before application of the voltage to Vb'. This magnetic functional device is characterized in reflecting a decrease in height of the potential barrier to modulation of the magnetic anisotropy of the ferromagnetic layer 131.

Figure 14:
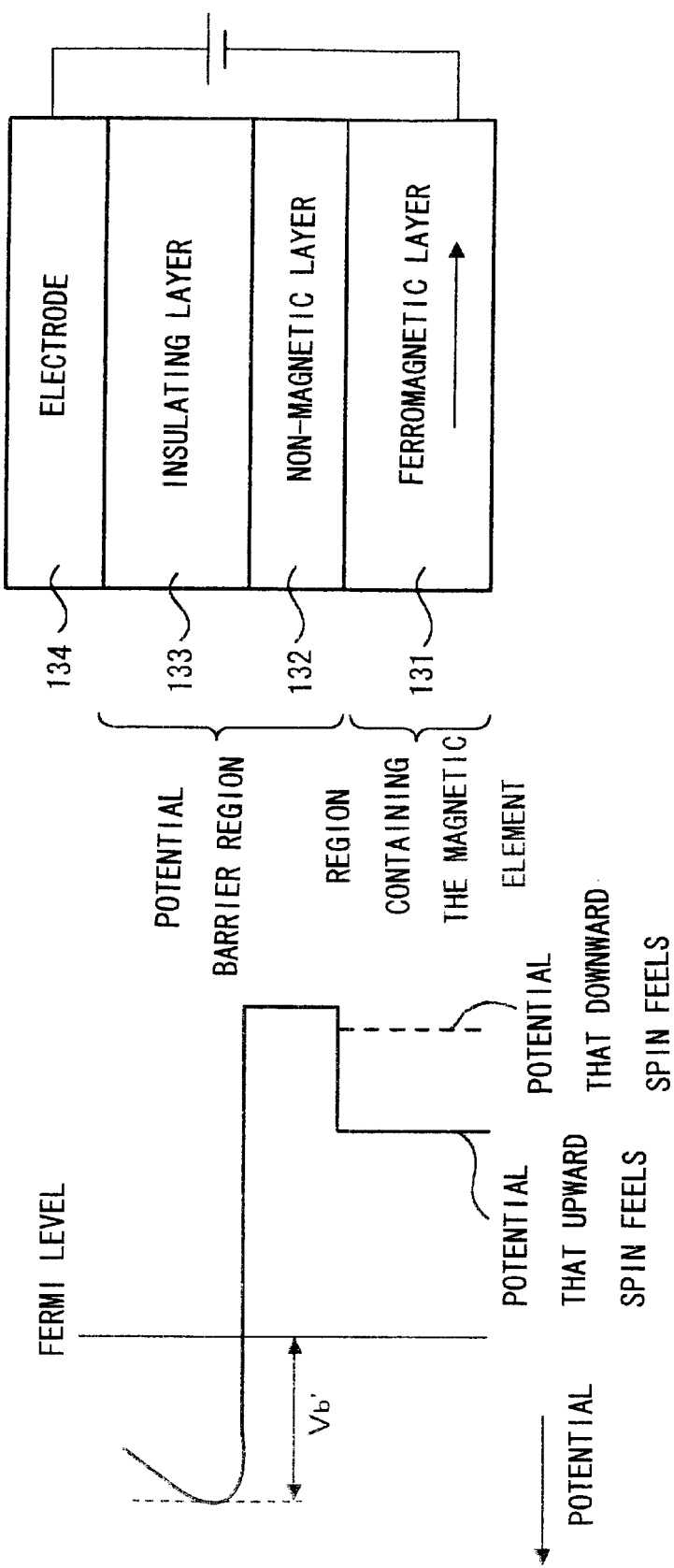
FIGS. 14A and 14B are a cross-sectional view showing the magnetic functional device according to the eleventh embodiment of the invention, and its potential diagram after application of a voltage.

Fundamentals of modulation of magnetic anisotropy of the ferromagnetic layer 131 by a decrease in height of the potential barrier are as already explained. Although direction of magnetization direction of the ferromagnetic layer 131 in FIGS. 13A and 13B is relatively unstable because of insufficient intensity of magnetic anisotropy, FIG. 14 shows that magnetic anisotropy increases by application of a voltage and the direction of magnetization is stabilized.

In this manner, according to the eleventh embodiment, since the insulating film 133 forming the potential barrier region is provided in indirect contact with the ferromagnetic layer 131 via the non-magnetic layer 132; the potential barrier of the potential barrier region is modulated by applying a voltage to the electrode 134; and magnetization of the ferromagnetic layer 131 is controlled by that modulation, magnetization of the ferromagnetic layer 131 can be readily controlled without using a magnetic field used conventionally. Additionally, in this case, since the insulating film 133 forming the potential barrier region may be located outside the ferromagnetic layer 131, the electrode 134 for input by application of a voltage can be made easily.

Figure 15:
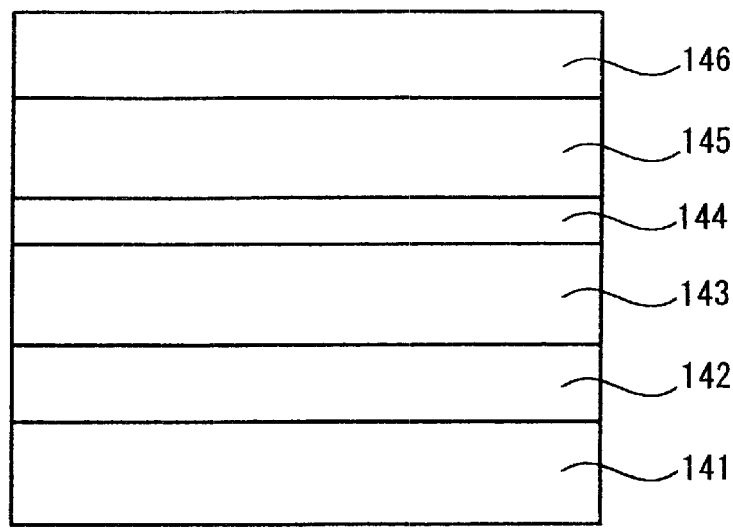
FIG. 15 is a cross-sectional view showing a magnetic functional device according to the twelfth embodiment of the invention.

FIG. 15 shows a magnetic functional device according to the twelfth embodiment of the invention. The twelfth embodiment is directed to an example having more specific configuration than the magnetic functional device according to the eleventh embodiment.

As shown in FIG. 15, in the magnetic functional device, a single-layered ferromagnetic layer 143 is provided on a substrate 141 via a base layer 142; a non-magnetic layer 144 and an insulating layer 145 forming the potential barrier region are stacked thereon; and an electrode 146 is further formed thereon.

Usable as the substrate 141, base layer 142 and ferromagnetic layer 143 are those proposed in the second embodiment. Usable as the non-magnetic layer 144 is any of precious metals or transition metals like Au, Ag and Cu, for example. As the insulating layer 145 used as the potential barrier region, any of the materials proposed in the second embodiment can be used.

Figure 16:
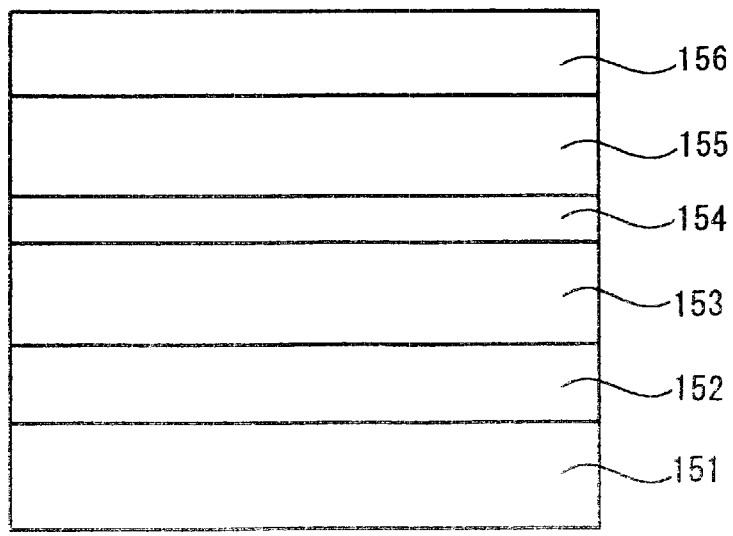
FIG. 16 is a cross-sectional view showing a magnetic functional device according to the thirteenth embodiment of the invention.

FIG. 16 shows a magnetic functional device according to the thirteenth embodiment of the invention.

This magnetic functional device corresponds to a version using a Schottky barrier produced along the interface between a semiconductor and a metal in lieu of the potential barrier region consisting of the insulating film 145 in the magnetic functional device according to the twelfth embodiment. More specifically, as shown in FIG. 16, in the magnetic functional device, a base layer 152 and a single-layered ferromagnetic layer 153 are sequentially stacked on a substrate 151; a non-magnetic layer 154 and a semiconductor layer 155 are sequentially stacked thereon; and an electrode 156 is further provided thereon. In this case, the Schottky barrier region constitutes the potential barrier region.

Figure 17:
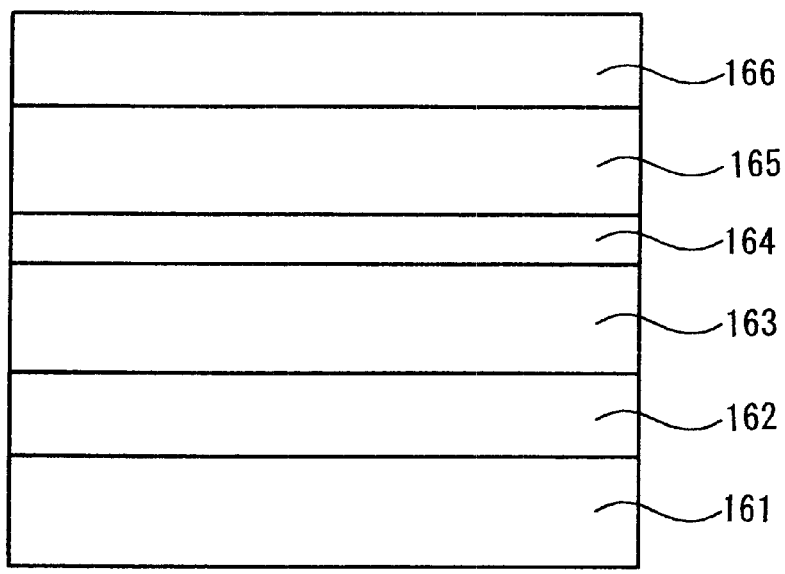
FIG. 17 is a cross-sectional view showing a magnetic functional device according to the fourteenth embodiment of the invention.

FIG. 17 shows a magnetic functional device according to the fourteenth embodiment of the invention.

The magnetic functional device shown here corresponds to a version modified from the twelfth embodiment by vertically reversing the ferromagnetic layer 143, non-magnetic layer 144 and potential barrier region so as to locate the potential barrier region nearer to the substrate. More specifically, as shown in FIG. 17, in the magnetic function device, the potential barrier region consisting of an insulating film 163 is formed on a substrate 161 via a base layer 162; a non-magnetic layer 164 and a ferromagnetic layer are sequentially stacked thereon; and an electrode 166 is further formed thereon.

Figure 18:
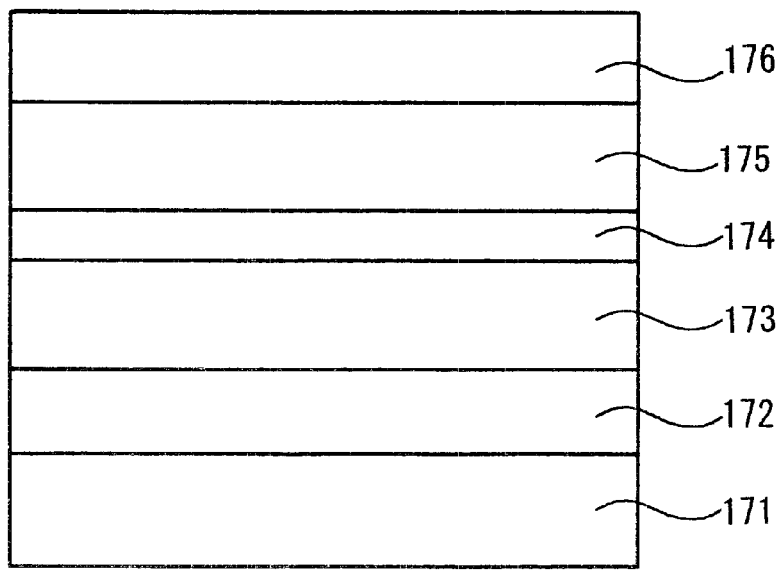
FIG. 18 is a cross-sectional view showing a magnetic functional device according to the fifteenth embodiment of the invention.

FIG. 18 shows magnetic functional device according to the fifteenth embodiment of the invention.

The magnetic functional device shown here is a version using a Schottky barrier produced along the interface between a semiconductor and a metal instead of the Schottky barrier made of the insulating film 163 in the magnetic functional device according to the fourteenth embodiment. More specifically, as shown in FIG. 18, in this magnetic functional device, a semiconductor layer 173 is stacked on a substrate 171 via a base layer 172; a non-magnetic layer 174 and a ferromagnetic layer 175 are sequentially stacked thereon; and an electrode 176 is further formed thereon. In this case, a Schottky barrier made between the semiconductor layer 173 and the non-magnetic layer 174 serves as the potential barrier region.

Having described specific preferred embodiments of the present invention with reference to the accompanying drawings, it is to be understood that the inventions is not limited to those precise embodiments, and that various changes and modifications may be effected therein by one skilled in the art without departing from the scope or the spirit of the invention as defined in the appended claims.

For example, numerical values, structures, configurations and materials proposed in the description of the embodiments are mere examples, and other appropriate numerical values, structures, configurations and materials, for example, may be used if necessary.

As explained above, according to the invention, since a potential barrier region is provided in direct or indirect contact with a region containing a magnetic element, and magnetization of the region containing a magnetic body is controlled by modulating the potential barrier of the potential barrier region, magnetization can be controlled without the use of a magnetic field. As a result, a number of problems involved in conventional. techniques can be solved simultaneously, in various aspects, such as enabling the electrode for input by application of a voltage, for example, to be readily made. This ensures realization of highly ideal solid-state memory which is short in access time, easy in high integration, nonvolatile, increased in number of events of rewriting, and free from cross-talk, for example.

What is claimed is:

1. A magnetization control method comprising:

placing a potential barrier region in direct or indirect contact with a region including a magnetic element, said region including a magnetic element having a multi-layered structure comprising a plurality of ferromagnetic metal layers separated by a non-magnetic metal intermediate layer; and controlling relative placement of magnetization of said ferromagnetic metal layers within said region including a magnetic element by controlling at least one of the height and width of the potential barrier of said potential barrier region by applying an electric field to said potential barrier region.

2. The magnetization control method according to claim 1 wherein said region containing a magnetic body is a single ferromagnetic layer, said potential barrier region being a potential barrier layer formed in contact with said ferromagnetic layer via a non-magnetic layer having a thickness not thinner than a one atom layer, direction of magnetization of said ferromagnetic layer being controlled by controlling height and/or width of the potential barrier of said potential barrier layer.

3. The magnetization control method according to claim 1 wherein said region containing a magnetic body is a single ferromagnetic layer, said potential barrier region being a potential barrier layer formed along an interface thereof with a semiconductor layer located in contact with said ferromagnetic layer via a non-magnetic layer having a thickness not thinner than a one atom layer, direction of magnetization of said ferromagnetic layer being controlled by controlling height and/or width of the potential barrier of said potential barrier layer by application of an electric field to said potential barrier layer.

4. The magnetization control method according to claim 1 wherein said region containing a magnetic body is a single ferromagnetic layer, said potential barrier region being a potential barrier layer consisting of an insulating layer located in contact with said ferromagnetic layer via a non-magnetic layer having a thickness not thinner than a one atom layer, direction of magnetization of said ferromagnetic layer being controlled by controlling height and/or width of the potential barrier of said potential barrier layer by application of an electric field to said potential barrier layer.

5. An information storage method comprising:

placing a potential barrier region in direct or indirect contact with a region including a magnetic element, said region including a magnetic element having a multi-layered structure comprising a plurality of ferromagnetic metal layers separated by a non-magnetic metal intermediate layer, and said potential barrier region being a potential barrier layer formed along an interface thereof with a semiconductor layer located outside said multi-layered structure in the stacking direction thereof;

controlling relative placement of magnetization of said ferromagnetic layers within said region including a magnetic element by controlling at least one of the height and width of the potential barrier of said potential barrier layer by applying an electric field to said potential barrier layer; and affecting storage of information by using at least one of magnetization of said region including a magnetic element.

6. A magnetic functional device comprising:

a structure including a potential barrier region placed in direct or indirect contact with a region including a magnetic element, said region containing a magnetic element having a multi-layered structure comprising a plurality of ferromagnetic metal layers: separated by a non-magnetic metal intermediate layer, and said potential barrier region being a potential barrier layer formed along an interface thereof with a semiconductor layer located outside said multi-layered structure in the stacking direction thereof, wherein relative placement of magnetization of said ferromagnetic metal layers within said region including a magnetic element is controlled by controlling at least one of the height and width of the potential barrier of said potential barrier layer by applying an electric field to said potential barrier layer.

7. An information storage device comprising:

a structure including a potential barrier region placed in direct or indirect contact with a region including a magnetic element, said region including a magnetic element having a multi-layered structure comprising a plurality of ferromagnetic metal layers separated by a non-magnetic metal intermediate layer, and said potential barrier region being a potential barrier layer formed along an interface thereof with a semiconductor layer located outside said multi-layered structure in the stacking direction thereof, wherein the relative placement of magnetization of said ferromagnetic layers within said region containing a magnetic element is controlled by controlling at least one of the height and width of said potential barrier layer by applying an electric field to said potential barrier layer, and storage of information is effected by using at least one of magnetization of said region including a magnetic element.

8. A magnetization control method comprising:

placing a potential barrier region in direct or indirect contact with a region including a magnetic element, said potential barrier region being a potential barrier layer comprising an insulating layer located outside said multi-layered structure in the stacking direction thereof, and said region including a magnetic element having a multi-layered structure composed of a plurality of ferromagnetic metal layers separated by a non-magnetic metal intermediate layer; and controlling relative placement of magnetization of said ferromagnetic metal layers within said region including a magnetic element by controlling qt least one of the height and width of the potential barrier of said potential barrier layer by applying an electric field to said potential barrier layer.

9. A magnetization control method comprising:

placing a potential barrier region in direct or indirect contact with a region including a magnetic element, said region including a magnetic element being a single ferromagnetic layer, and said potential barrier region being a potential barrier layer formed along an interface thereof with a semiconductor layer located in contact with said ferromagnetic layer via a non-magnetic layer having a thickness of at least a one atom layer; and controlling the direction of magnetization of said ferromagnetic layer by controlling at least one of the height and width of the potential barrier of said potential barrier layer by applying an electric field to said potential barrier layer.

10. A magnetization control method comprising:

placing a potential barrier region in direct or indirect contact with a region including a magnetic element, said region including a magnetic element being a single ferromagnetic layer, and said potential barrier region being a potential barrier layer comprising an insulating layer located in contact with said ferromagnetic layer via a non-magnetic layer having a thickness of at least a one atom layer; and controlling the direction of magnetization of said ferromagnetic layer by controlling at least one of the height and width of the potential barrier of said potential barrier layer by applying an electric field to said potential barrier layer.

11. An information storage method comprising:

placing a potential barrier region in direct or indirect contact with a region including a magnetic element, said region including a magnetic element having a multi-layered structure comprising a plurality of ferromagnetic metal layers separated by a non-magnetic metal intermediate layer, and said potential barrier region being a potential barrier layer comprising an insulating layer located outside said multi-layered structure in the stacking direction thereof;

controlling the relative placement of magnetization of said ferromagnetic metal layers within said region including a magnetic element by controlling at least one of the height and width of the potential barrier of said potential barrier layer; and, affecting the storage of information by using at least one of magnetization of said region containing a magnetic element.

12. An information storage method comprising:

placing a potential barrier region in direct or indirect contact with a region including a magnetic element, said region including a magnetic element being a single ferromagnetic layer, and said potential barrier region being a potential barrier layer formed along an interface thereof with a semiconductor layer located in contact with said ferromagnetic layer via a non-magnetic layer having a thickness of at least one atom layer;

controlling the direction of magnetization of said ferromagnetic layer by controlling at least one of the height and width of the potential barrier of said potential barrier layer by applying an electric field to said potential barrier layer; and affecting the storage of information by using at least one of magnetization of said region including a magnetic element.

13. An information storage method comprising:

placing a potential barrier region in direct or indirect contact with a region including a magnetic element, said region including a magnetic element being a single ferromagnetic layer, and said potential barrier region being a potential barrier layer comprising an insulating layer located in contact with said ferromagnetic layer via a non-magnetic layer having a thickness of at least one atom layer;

controlling the direction of magnetization of said ferromagnetic layer by controlling at least one of the height and width of the potential barrier of said potential barrier layer by applying an electric field to said potential barrier layer; and affecting the storage of information by using at least one of magnetization of said region including a magnetic element.

14. A magnetic functional device comprising:

a structure including a potential barrier region placed in direct or indirect contact with a region including a magnetic element, said region including a magnetic element having a multi-layered structure comprising a plurality of ferromagnetic metal layers separated by a non-magnetic metal intermediate layer, and said potential barrier region being a potential barrier layer comprising an insulating layer located outside said multi-layered structure in the stacking direction thereof, wherein the relative placement of magnetization of said ferromagnetic metal layers within said region including a magnetic element is controlled by controlling at least one of the height and width of the potential barrier of said potential barrier layer by applying an electric field to said potential barrier layer.

15. A magnetic functional device comprising:

a structure including a potential barrier region placed in direct or indirect contact with a region including a magnetic element, said region including a magnetic element being a single ferromagnetic layer, and said potential barrier region being a potential barrier layer formed along an interface thereof with a semiconductor layer located in contact with said ferromagnetic layer via a non-magnetic layer having a thickness of at least one atom layer, wherein the direction of magnetization of said ferromagnetic layer is controlled by controlling at least one of the height and width of the potential barrier of said potential barrier layer by application of an electric field to said potential barrier layer.

16. A magnetic functional device comprising:

a structure including a potential barrier region placed in direct or indirect contact with a region including a magnetic element, said region including a magnetic element being a single ferromagnetic layer, and said potential barrier region being a potential barrier layer comprising an insulating layer located in contact with said ferromagnetic layer via a non-magnetic layer having a thickness of at least one atom layer, wherein the direction of magnetization of said ferromagnetic layer is controlled by controlling at least one of the height and width of the potential barrier of said potential barrier layer by applying an electric field to said potential barrier layer.

17. An information storage device comprising:

a structure including a potential barrier region placed in direct or indirect contact with a region including a magnetic element, said region including a magnetic element having a multi-layered structure comprising a plurality of ferromagnetic metal layers separated by a non-magnetic metal intermediate layer, and said potential barrier region being a potential barrier layer comprising an insulating layer located outside said multi-layered structure in the stacking direction thereof, wherein the relative placement of magnetization of said ferromagnetic metal layers within said region including a magnetic element is controlled by controlling at least one of the height and width of the potential barrier of said potential barrier layer by applying an electric field to said potential barrier layer, and storage of information is effected by using at least one of magnetization of said region including a magnetic element.

18. An information storage device comprising:

a structure including a potential barrier region placed in direct or indirect contact with a region including a magnetic element, said region including a magnetic element being a single ferromagnetic layer, and said potential barrier region being a potential barrier layer formed along an interface thereof with a semiconductor layer located in contact with said ferromagnetic layer via a non-magnetic layer having a thickness of at least one atom layer, wherein the direction of magnetization of said ferromagnetic layer is controlled by controlling at least one of the height and width of the potential barrier of said potential barrier layer by applying an electric field to said potential barrier layer, and storage of information is effected by using at least one of magnetization of said region including a magnetic element.

19. An information storage device comprising:

a structure including a potential barrier region placed in direct or indirect contact with a region including a magnetic element, said region including a magnetic element being a single ferromagnetic layer, and said potential barrier region being a potential barrier layer comprising an insulating layer located in contact with said ferromagnetic layer via a non-magnetic layer having a thickness of at least one atom layer, wherein the direction of magnetization of said ferromagnetic layer is controlled by controlling at least one of the height and width of the potential barrier of said potential barrier layer by applying an electric field to said potential barrier layer, and storage of information is effected by using at least one of magnetization of said region including a magnetic element.

\* \* \* \* \*